US012690199B2

(12) United States Patent
Bauer et al.

(10) Patent No.:  US 12,690,199 B2
(45) Date of Patent:      Jul. 21, 2026

(54) METHOD OF FABRICATING HIGH ACCURACY EMBEDDED RESISTORS IN FLEX SUBSTRATES

(71) Applicant: Eagle Technology, LLC, Melbourne, FL (US)

(72) Inventors: Matt Bauer, Melbourne, FL (US); Jamel Burruss, Palm Bay, FL (US); Steven Kobosko, Vienna, VA (US)

(73) Assignee: Eagle Technology, LLC, Melbourne, FL (US)

( * ) Notice: Subject to any disclaimer, the term of this patent is extended or adjusted under 35 U.S.C. 154(b) by 497 days.

(21) Appl. No.: 18/476,521

(22) Filed: Sep. 28, 2023

(65) Prior Publication Data

US 2025/0113501 A1      Apr. 3, 2025

(51) Int. Cl.
H10D 1/47          (2025.01)
H01C 1/01          (2006.01)
(Continued)

(52) U.S. Cl.
CPC .............. H10D 1/474 (2025.01); H01C 1/01 (2013.01); H01C 17/22 (2013.01); H01C 17/30 (2013.01);
(Continued)

(58) Field of Classification Search
CPC ..... H10D 1/474; H10D 86/85; H10W 70/688; H10W 70/05; H10W 70/69; H01C 1/01; H01C 17/22; H01C 17/30; H01C 7/006
See application file for complete search history.

(56) References Cited

U.S. PATENT DOCUMENTS 5,675,310 A  *  10/1997  Wojnarowski ......... H05K 1/167
                                                                              29/621
6,278,127 B1 *   8/2001  Dodabalapur ....... H10K 10/486
                                                                              257/66
(Continued)

FOREIGN PATENT DOCUMENTS

CN          112687796 A      4/2021
CN          114203924       *   3/2022   ............. H10K 71/00
(Continued)

OTHER PUBLICATIONS

CN-114203924 machine translation (Year: 2022).*
(Continued)

*Primary Examiner* — Kyung S Lee
(74) *Attorney, Agent, or Firm* — Edell, Shapiro & Finnan, LLC

(57)          ABSTRACT
A method comprising: forming a polyimide layer; forming a thin film resistor on the polyimide layer; forming, on the thin film resistor and the polyimide layer, a metallization layer that includes metal contacts on opposing ends of the thin film resistor but leaves an exposed surface of the polyimide layer; baking the polyimide layer, the thin film resistor, and the metallization layer to remove water from the polyimide layer; forming, on the exposed surface of the polyimide layer, a hydrophobic moisture barrier layer that prevents absorption of water into the polyimide layer to avoid blistering of the thin film resistor during subsequent laser trimming of the thin film resistor; and laser trimming a resistance of the thin film resistor between the metal contacts.

20 Claims, 9 Drawing Sheets

(51) Int. Cl.

| | |
|---|---|
| *H01C 7/00* | (2006.01) |
| *H01C 17/22* | (2006.01) |
| *H01C 17/30* | (2006.01) |
| *H10D 86/85* | (2025.01) |
| *H10W 70/05* | (2026.01) |
| *H10W 70/67* | (2026.01) |
| *H10W 70/69* | (2026.01) |

(52) U.S. Cl.
CPC ............ *H10D 86/85* (2025.01); *H10W 70/05* (2026.01); *H10W 70/688* (2026.01); *H01C 7/006* (2013.01); *H10W 70/69* (2026.01)

(56) References Cited

U.S. PATENT DOCUMENTS

| | | | | |
|---|---|---|---|---|
| 8,487,400 | B2 | 7/2013 | Lin | |
| 9,528,888 | B2 | 12/2016 | Wolkin et al. | |
| 10,763,016 | B2 | 9/2020 | Tamagawa et al. | |
| 2002/0076913 | A1* | 6/2002 | Lee | H10W 72/012 |
| | | | | 257/E21.508 |
| 2002/0155386 | A1* | 10/2002 | Xu | H10W 20/077 |
| | | | | 257/E21.27 |
| 2007/0020451 | A1* | 1/2007 | Padiyath | B05D 7/546 |
| | | | | 428/408 |
| 2011/0143129 | A1* | 6/2011 | Padiyath | C08J 7/043 |
| | | | | 428/336 |
| 2016/0240483 | A1* | 8/2016 | Cheng | H10W 20/425 |

FOREIGN PATENT DOCUMENTS

| | | |
|---|---|---|
| JP | 2007077439 A | 3/2007 |
| JP | 2007262481 A | 10/2007 |
| JP | 6309119 B2 | 4/2018 |
| KR | 20090028769 A | 3/2009 |

OTHER PUBLICATIONS

K.L. Coates, et al., "Development of thin film resistors for use in multichip modules", Proceedings 1998 International Conference on Multichip Modules and High Density Packaging (Cat. No. 98EX154), IEEE, Apr. 1998, 6 pages.

H. Takasago, et al., "Advanced Copper/Polyimide Hybrid Technology", IEEE Transactions on Components, Hybrids, and Manufacturing Technology, vol. CHMT-10, No. 3, Sep. 1987, 8 pages.

T. Lenihan, et al., "Embedded Thin Film Resistors, Capacitors and Inductors in Flexible Polyimide Films", 1996 Proceedings 46th electronic components and technology conference, IEEE, 1996, 6 pages.

\* cited by examiner

RESISTOR TRIMMING WITH TREATMENT

RESISTOR TRIMMING WITH TREATMENT 1104
(COATED WITH MOISTURE
BARRIER LAYER)

CONTACT

1102

1106

CONTACT

METHOD OF FABRICATING HIGH ACCURACY EMBEDDED RESISTORS IN FLEX SUBSTRATES

TECHNICAL FIELD

The present disclosure relates generally to fabricating thin film resistors in a flexible integrated circuit (IC) stack.

BACKGROUND

Flexible electronics offer a wide array of opportunities in decreasing size, weight, and power (SWaP) in electronics. The more components that can be included in flex redistribution layers (RDLs) of an integrated circuit (IC), the lower the SWAP that can be realized. A limiting factor in decreasing SWaP is the difficulty of incorporating, into RDLs of a flex IC, thin film resistors that have high accuracy resistances. To avoid such difficulty, conventional flexible electronics incorporate significantly larger discrete surface mount resistors instead of RDL-integrated thin film resistors.

An RDL of an IC may include a polyimide dielectric layer or film. Deposition of low accuracy thin film resistors (i.e., thin film resistors that have low accuracy resistances) onto the flexible polyimide dielectric film is possible. The low accuracy thin film resistors may be sufficient for pull-up and pull-down circuits, for example, but not for circuits that use precision thin film resistors (i.e., thin film resistors that have high accuracy resistance values or circuits which require specific impedance under certain loads and frequencies). Attempts to laser trim the thin film resistors deposited on the polyimide film to target resistances typically result in blistering of the polyimide layer, rendering the IC useless. This is due to absorption of water into the polyimide film prior to laser trimming. The polyimide film pulls or absorbs the water from humidified air in contact with the polyimide film. During subsequent laser trimming, laser energy transferred to molecules of liquid water embedded in the polyimide film converts the liquid water to steam, which causes the polyimide film to blister. While low moisture absorption polyimides have been engineered, it is observed the small amounts of water absorbed into such films result in blistering as the rapid heating of the laser still causes blistering due to the ~1,600 times increase in volume over a short amount of time. This is in contrast to the moisture tolerance of active circuit operation which generally causes only very comparatively slow heating.

DESCRIPTION

Overview

In an embodiment, a method comprises: forming a polyimide layer; forming a thin film resistor on the polyimide layer; forming, on the thin film resistor and the polyimide layer, a metallization layer that includes metal contacts on opposing ends of the thin film resistor but leaves an exposed surface of the polyimide layer; baking the polyimide layer, the thin film resistor, and the metallization layer to remove water from the polyimide layer; forming, on the exposed surface of the polyimide layer, a hydrophobic moisture barrier layer that prevents absorption of water into the polyimide layer avoid blistering of the thin film resistor during subsequent laser trimming of the thin film resistor; and laser trimming a resistance of the thin film resistor between the metal contacts.

EXAMPLE EMBODIMENTS

An embodiment is directed to a method of fabricating a flexible IC that includes highly accurate, laser trimmed, thin film resistors deposited on a polyimide film (also referred to in the ensuing description as a "polyimide layer"). The method includes fabrication techniques that enable laser trimming of the thin film resistors to highly accurate resistance values (i.e., resistances), without blistering the polyimide layer. In part, the method includes baking-off moisture from the polyimide layer, depositing the thin film resistors on the polyimide layer, and performing a plasma surface treatment on an exposed surface of the polyimide layer to form a hydrophobic moisture barrier layer on the exposed surface. The hydrophobic moisture barrier layer substantially reduces or eliminates an affinity of the polyimide layer for water absorption.

The method further includes laser trimming the thin film resistors on the polyimide layer without blistering. The laser trimming may be performed without blistering even in high humidity environments and after the polyimide layer has been submerged in water. While testing, when the hydrophobic moisture barrier layer was formed, blistering was not present after the structure had been submerged in water for one hour. This stress test is notable as a modern distributed manufacturing environment circuits on non-flexible substrates are routinely shipped for resistor trimming, thus for economic processing it is important to account for as imperfect environments as possible during shipping, receipt, and trimming. The laser trimming trims the resistances of the thin film resistors to target resistances with very tight tolerances. In summary, the method advantageously produces a flexible polymer structure for the flexible IC that has a resistor layer and a moisture barrier surface, which enables resistor trimming to tolerances previously only achievable on rigid surfaces. The method may be applied to ICs in general and more specifically to flexible electronics, flex RDLs in fan-out wafer-level packaging (FOWLP), and multi-chip modules (MCMs).

Figure 1:
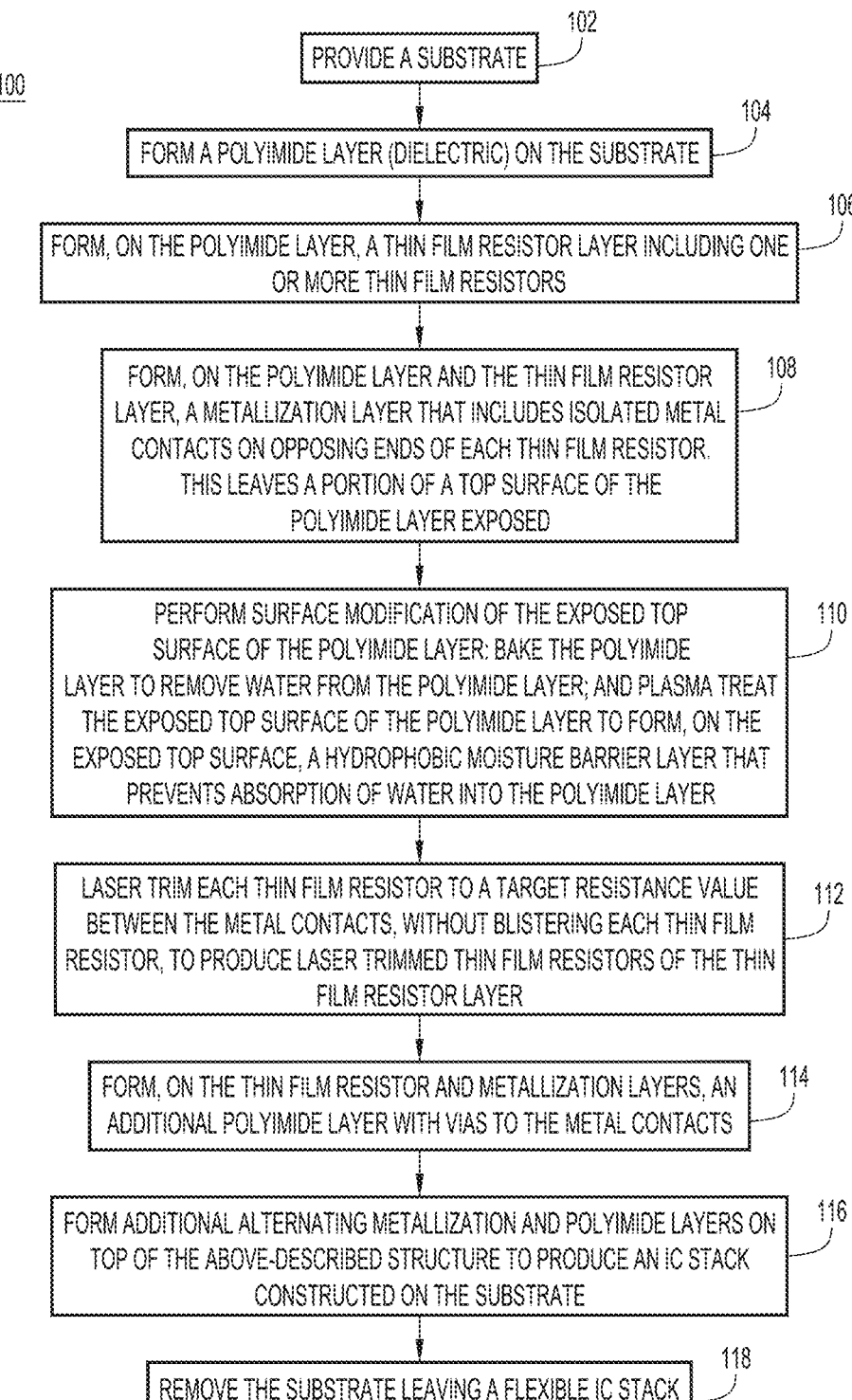
FIG. 1 is a flowchart of an example method of fabricating a flexible IC that includes laser trimmed thin film resistors without blistering of polyimide layers of the flexible IC.

FIG. 1 is a flowchart of an example method 100 of fabricating an IC (also referred to as a "semiconductor device" and a "IC stack") that is flexible. Sequential operations of method 100 are described also with sequential reference to FIGS. 2-9, which show sequentially added layers of the flexible IC, resulting from the sequential operations.

Figure 2:
FIG. 2 is a cross-sectional view of an example substrate upon which subsequent layers of a stack of the IC may be fabricated.

Method 100 begins with a substrate preparation process that includes operations 102-108, described below. Operation 102 includes providing a substrate on which subsequent layers may be fabricated for the IC. The substrate may comprise any suitable substrate for fabricating the subsequent layers, such as a silicon substrate. FIG. 2 is a cross-sectional view of an example substrate 200 provided by operation 102.

Operation 104 includes forming a polyimide layer on a top surface of the substrate. The polyimide layer may be fabricated via spin coating polyimide (e.g., 2611 or other HD Microsystems PI2600 series polyimides) at spin speeds such as 1000/2000/3000/4000/5000 RPM, for example. The spun polyimide layer may be baked on a hot plate to evaporate solvent. The spun polyimide layer may be baked with a slow temperature ramp rate to prevent bubbles from forming in the polyimide layer. A suitable temperature ramp may be from 40° C. to 140° C. at 10° C./minute, followed by holding at 140° C. for 1 minute. Following solvent evaporation by baking, the baked polyimide layer may be cured in a nitrogen atmosphere at an elevated temperature. For example, a suitable curing process may include ramping the temperature of the baked polyimide layer to 175° C. over 1 hour, holding that temperature for 1 hour, ramping the temperature to 340° C. over 1 hour 30 minutes, ramping the temperature to 375° C. over 1 hour, and holding that temperature for 30 minutes. An example thickness of the polyimide layer is a few (e.g., 3 μm) to many microns (e.g., 10 μm).

Figure 3:
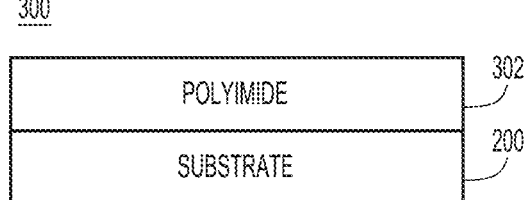
FIG. 3 is a cross-sectional view of an example stack that results from forming a polyimide layer on the substrate.

FIG. 3 is a cross-sectional view of an example structure or stack of layers (also referred to simply as a "stack") 300 that results from operation 104. Stack 300 includes a polyimide layer 302 (which may comprise multiple polyimide layers) formed on a top surface of substrate 200.

Returning to FIG. 1, operation 106 includes forming a thin film resistor layer including thin film resistors on a portion of a top surface of the polyimide layer. The thin film resistors may be formed using either a liftoff or etch process, for example. The liftoff process includes applying photoresist, exposing a resistor pattern, and developing the resistor pattern. The liftoff process further includes depositing resistor metal of choice (e.g. nickel chromium (NiCr), tantalum nitride (e.g., $Ta_2N$), chrome silicide (e.g., $CrSi_2$), or the like) using sputtering, evaporation, or other similar technique. The liftoff process finally includes soaking the stack in an appropriate solvent to liftoff the photoresist. Alternatively, the etch process includes depositing the resistor metal, applying the patterned photoresist, and then etching the resistor metal with an appropriate etchant. The etch process finally includes stripping the resist. An end result of both processes is patterned thin film resistors formed on a portion of a top surface of the polyimide layer. Example thicknesses for the thin film resistors are in the range of 100-200 nm. The patterned thin film resistors leave a portion of the top surface of the polyimide layer exposed, i.e., leave an exposed surface of the polyimide layer.

Figure 4:
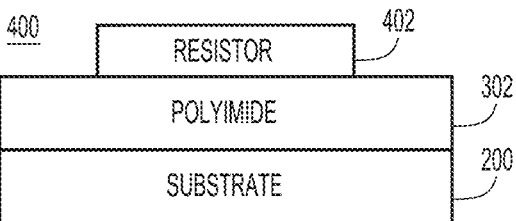
FIG. 4 is a cross-sectional view of an example stack that results from forming a thin film resistor layer including a resistor on the stack of FIG. 3.

FIG. 4 is a cross-sectional view of an example stack 400 that results from operation 106. Stack 400 includes substrate 200, polyimide layer 302 formed on the substrate, and a thin film resistor 402 formed on a portion of a top surface of the polyimide layer. Thin film resistor 402 is untrimmed at this stage of the fabrication. While only a single thin film resistor is shown in FIG. 3, it is understood that operation 106 may fabricate a thin film resistor layer having many individual thin film resistors spaced across the top surface of polyimide layer 302.

Returning to FIG. 1, operation 108 includes forming a metallized conductor layer (i.e., a metallization layer), including metal contacts (e.g., for probe tips and/or vias described below) on top of the thin film resistor layer, via metal liftoff, electroplating, or blanket deposition and etch, for example. A number of metallic materials may comprise the conductor layer including copper, aluminum, tungsten, and the like, with a number of adhesion layers including chromium, titanium, and the like. An example metal thickness is 3 μm. The patterned thin film resistors and the metallized conductor layer leave a portion of the top surface of the polyimide layer exposed, i.e., leave an exposed top surface of the polyimide layer.

Figure 5:
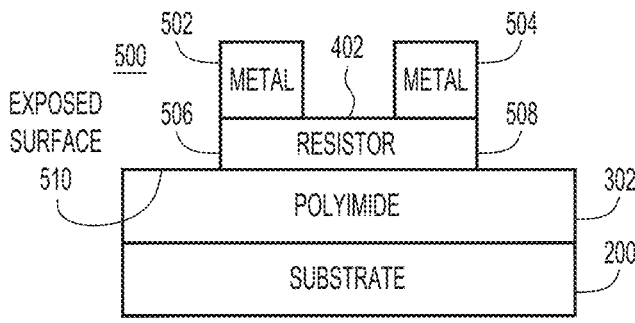
FIG. 5 is a cross-sectional view of an example stack that results from forming a metallization layer with metal contacts on the stack of FIG. 4.

FIG. 5 is a cross-sectional view of an example stack 500 that results from operation 108. Stack 500 includes substrate 200, polyimide layer 302 formed on the substrate, thin film resistor 402 formed on the polyimide layer, and spaced-apart first and second metal contacts 502 and 504 formed on correspondingly spaced-apart first and second opposing sides or ends 506 and 508 of the thin film resistor. Polyimide layer 302 includes an exposed top surface 510 that is left uncovered by thin film resistor 402 and the metallization layer including metal contacts 502 and 504.

Returning to FIG. 1, operation 110 is a surface modification operation that forms a hydrophobic moisture barrier layer on the exposed top surface of the polyimide layer. Operation 110 includes the following sequential operations:

a. Baking the stack fabricated by operations 102-108 (e.g., baking stack 500) at 125° C. under dry Nitrogen ($N_2$) for approximately 8 hours. The purpose of this step is to completely remove water from the polyimide layer (e.g., polyimide layer 302 in FIG. 5).

b. Allowing the stack to cool to room temperature (RT) under dry Nitrogen.

c. Using a reactive ion etcher (RIE), for example, performing plasma treatment on the exposed surface of the polyimide layer (i.e., plasma treating the exposed surface) with the following example plasma treatment parameters/settings: power=500 W, pressure=60 mT, gas=carbon tetrafluoride ($CF_4$), gas flow rate=30 sccm, for 30 seconds. Variations of the plasma treatment parameters/settings are possible. For example, the power may be above or below 500 W, the pressure may be above or below 60 mT, and the gas flow rate may be above or below 30 sccm. The plasma treatment forms/creates on the formally exposed top surface of the polyimide layer a hydrophobic moisture barrier layer that prevents water ingress into the polyimide layer and thus allows the thin film resistors to be laser trimmed without blistering (i.e., to avoid blistering of) the polyimide layer. In this example, the hydrophobic moisture barrier layer includes a fluorinated moisture barrier layer with surface moisture barrier properties.

Figure 6:
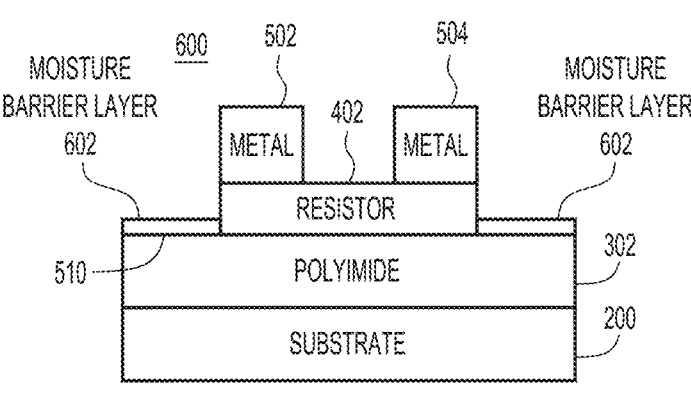
FIG. 6 is a cross-sectional view of an example stack that results from forming a hydrophobic moisture barrier layer on the stack of FIG. 5.

FIG. 6 is a cross-sectional view of an example stack 600 that results from operation 110. Stack 600 includes substrate 200, polyimide layer 302 formed on the substrate, thin film resistor 402 formed on the polyimide layer, first and second metal contacts 502 and 504 formed on the thin film resistor, and a hydrophobic moisture barrier layer 602 (e.g., a fluorinated moisture barrier layer) formed on previously exposed top surface 510 of the polyimide layer. Hydrophobic moisture barrier layer 602 hermetically seals previously exposed top surface 510 of polyimide layer 302 against water absorption/ingress that would otherwise occur.

Figure 7:
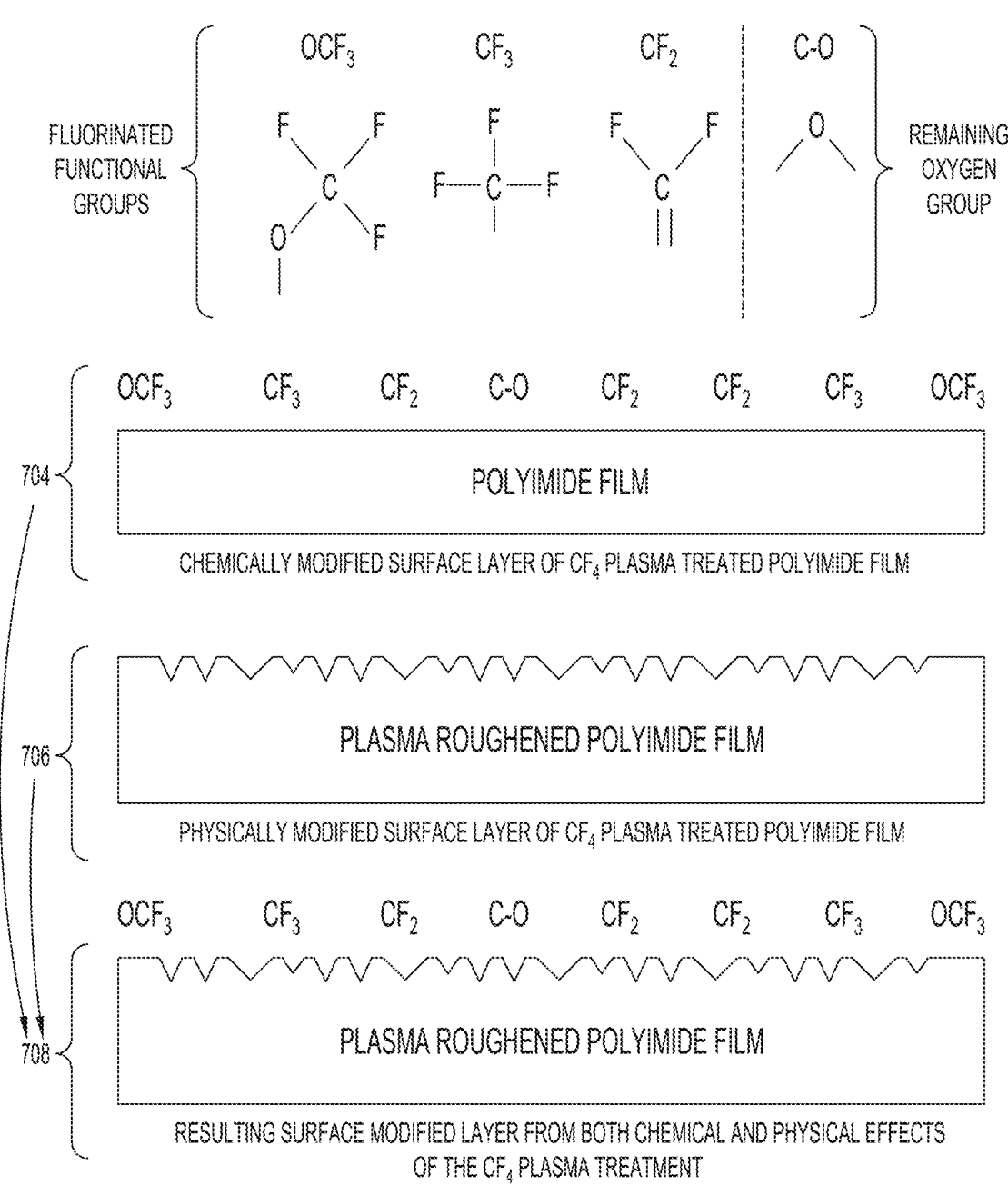
FIG. 7 is an illustration of chemical and physical sources that contributed to a moisture barrier property of the hydrophobic moisture barrier layer.

FIG. 7 is an illustration of sources of the moisture barrier property of the hydrophobic moisture barrier layer. In FIG. 7, the term "film" is used in place of "layer." The moisture barrier property of the hydrophobic moisture barrier layer derives from two sources, including (i) as shown at 704, chemical modification of the top surface of the polyimide layer with fluorinated functional groups (e.g., $OCF_3$, $CF_3$, $CF_2$, and so on) to produce a surface functionalized top layer of the hydrophobic moisture barrier layer, as well as a few oxygenated groups which will still likely remain in low concentrations (e.g., C—O), and (ii) as shown at 706, physical modification of the top surface of the polyimide layer to produce an increased roughness at the top surface, which collectively result in the surface modified layer 708 (e.g., hydrophobic moisture barrier layer 602 of stack 600). The above-mentioned fluorinated functional groups are highly electronegative and have a small atomic diameter leading to strong hydrophobicity in the polyimide surface coated by the fluorinated functional groups. The physical roughening of the surface of the polyimide surface amplifies or enhances this property by increasing the amount of surface exposed to moisture which has this hydrophobic functionalization. In another example, the above-described process may use chlorinated functional groups to produce a chlorinated moisture barrier layer instead of the fluorinated moisture barrier layer. In this case, the plasma treatment may employ gaseous carbon tetrachloride instead of gaseous carbon tetrafluoride. Other fluorinated plasmas which may be used to obtain a hydrophobic surface include $SF_6$, $CBrF_3$, and $CHF_3$.

Iterative surface modification experiments established plasma surface treatment parameters that achieve an optimal degree of surface chemical and physical modification for hydrophobicity. For example, a sufficiently high plasma power, pressure, and flow rate is desirable to achieve chemical modification of the polyimide layer, replacing surface hydrogen and oxygen groups with fluorinated compounds. To achieve increased roughness, a sufficiently high power as well as a sufficiently low pressure is employed to allow for a high enough mean free path to bombard the polyimide surface with ions.

Returning to FIG. 1, after modifying the polyimide surface in operation 110, the thin film resistors are ready to be laser trimmed to accurate target resistance values. Operation 112 includes laser trimming the thin film resistors to accurate laser trimmed resistances, to produce laser trimmed thin film resistors. For example, operation 110 laser trims thin film resistor 402 of stack 600 to produce a laser trimmed resistor. Laser trimming is described below in connection with FIG. 10.

Figure 8:
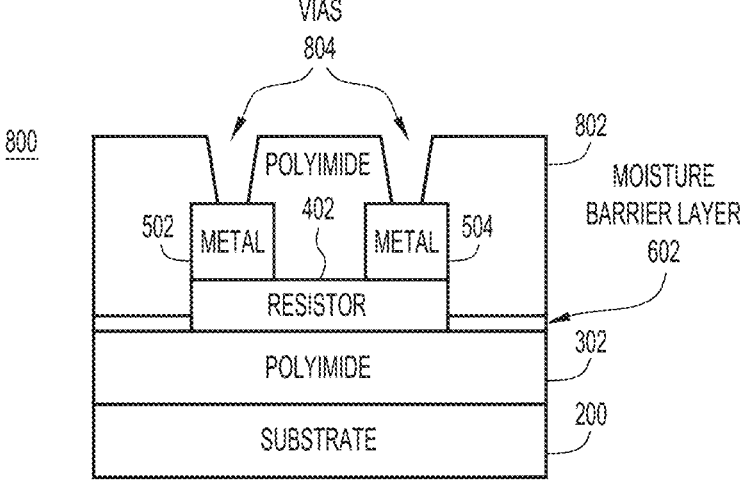
FIG. 8 is a cross-sectional view of an example stack that results from forming an additional polyimide layer with vias for metal on the stack of FIG. 6.

Post laser trimming processes are now described. Operation 114 includes forming an additional polyimide layer on top of the thin film resistor layer/metal contact layer (collectively referred to as the "resistor/metal contact layers"). The additional polyimide layer may be formed using an operation similar to operation 104 described above. Operation 114 further includes creating vias in the additional polyimide layer to receive via metal to connect upper metal layers to the metal layer below the additional polyimide layer. Creating the vias includes depositing a hard mask such as titanium/copper via liftoff to define the via locations and then etching with an oxygen plasma. Alternatively, if the polyimide layer is photosensitive, creating the vias may include exposing and developing the polyimide layer prior to curing. In other arrangements, vias may be made in the polyimide layer under the thin film resistor layer, if desired. In this case, operation 114 is performed after operation 104 during the substrate preparation. FIG. 8 is a cross-sectional view of an example stack 800 that results from operation 114. Stack 800 includes additional polyimide layer 802 with vias 804 (to receive metal) spaced-apart from each other to coincide with metal contacts 502, 504.

Returning to FIG. 1, operation 116 includes forming alternating metal layers (e.g. copper, aluminum, and the like) and polyimide layers on the stack that results from operation 114, according to a desired IC design. That is, operation 116 forms, on top of the stack formed by operation 114, multiple metal layers and multiple polyimide layers with vias alternated with the multiple metal layers. The alternating layers may be formed using operations similar to those described above for the corresponding layers.

Figure 9:
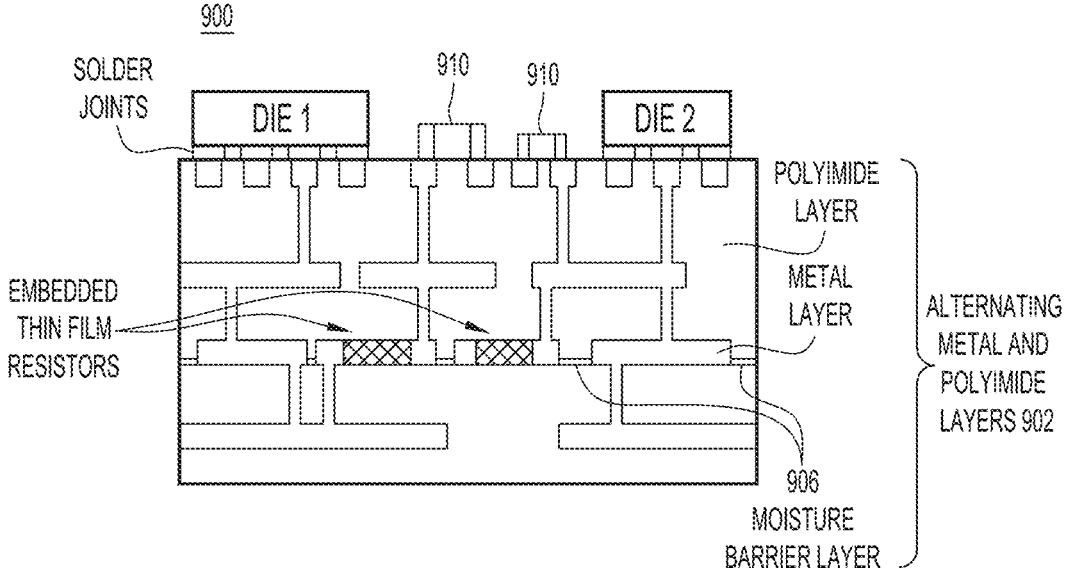
FIG. 9 is a cross-sectional view of an example flexible IC stack that results from forming alternated metal and polyimide layers on an IC stack and removing the substrate from the IC stack.

Operation 118 includes removing the substrate from the IC stack formed by operation 116. This leaves IC stack in a flexible form, i.e., a flexible IC stack. FIG. 9 is an example flexible IC stack 900 formed by operation 118. Flexible IC stack 900 that includes alternated metal and polyimide layers 902, embedded thin film resistors R1, R2 that are laser trimmed, and a hydrophobic moisture barrier layer 906, as shown. The flexible IC stack also includes dies 1 and 2 soldered to a top metal layer, and chip resistors 910 soldered to the top metal layer.

Figure 10:
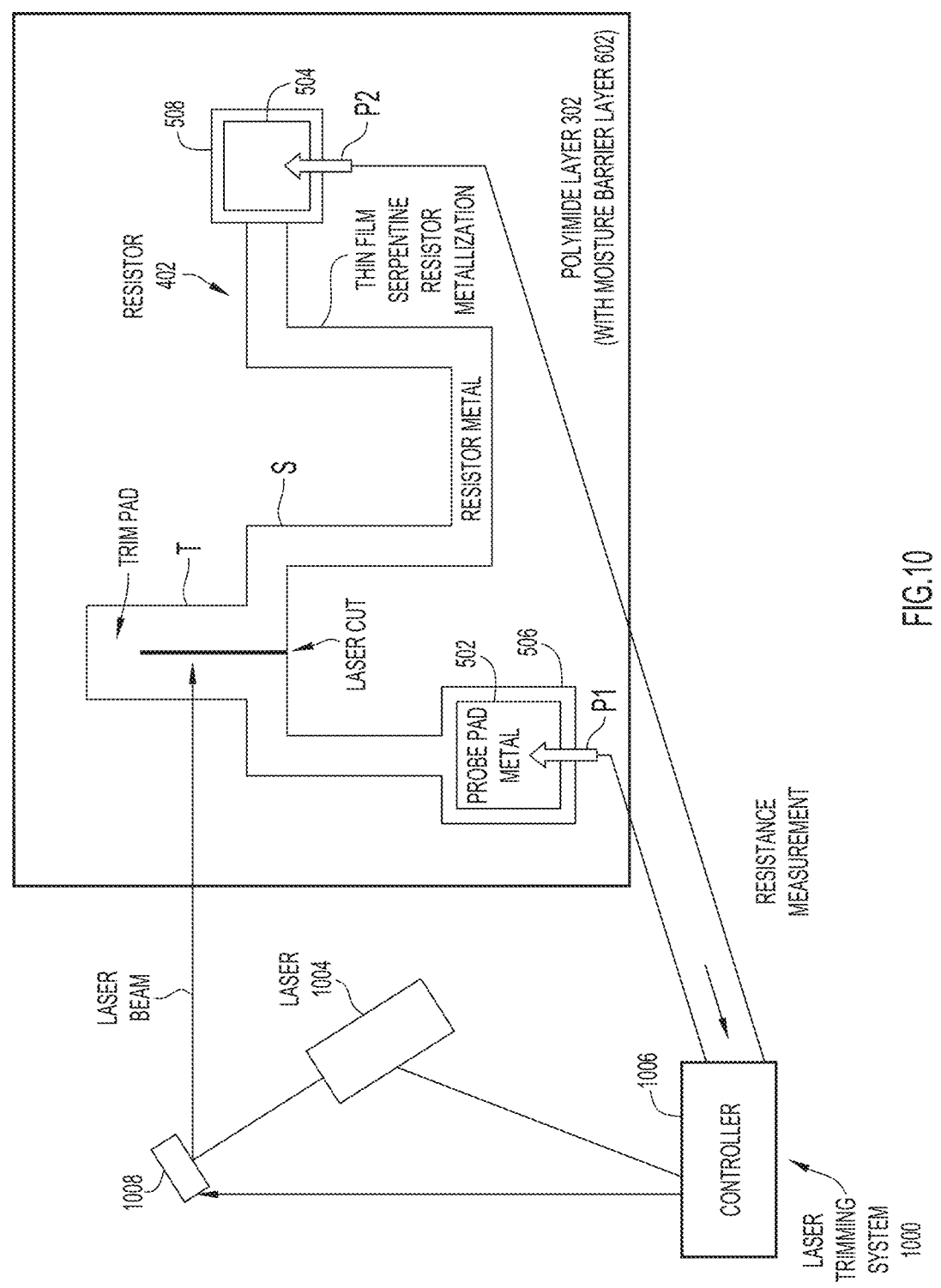
FIG. 10 is an illustration of an example laser trimming system used to laser trim a thin film resistor shown in plan view.

A method of laser trimming a thin film resistor performed after surface modification operation 110 is performed is now described in connection with FIG. 10. FIG. 10 is an illustration of an example laser trimming system 1000 used to laser trim thin film resistor 402 of stack 600. FIG. 10 also shows a plan view of stack 600. The plan view shows thin film resistor 402 and moisture barrier layer 602 formed on polyimide layer 302. The resistor metal of thin film resistor 402 includes a serpentine strip S that connects opposing ends 506, 508 of the thin film resistor (and thus metal contacts 502 and 504) to each other, and also includes a "top hat" shaped trim pad T connected to and extending away from the serpentine strip. Other thin film resistor configurations are possible. Laser trimming system 1000 include a laser 1004 to generate laser energy, a controller 1006 to control the laser (e.g., turn on and turn off the laser), a galvanometer ("galvo") 1008 having movable mirrors to deflect the laser energy to a precise location on trim pad T to ablate/laser trim the trim pad responsive to commands issued by the controller, and resistance measurement/sense probes P1 and P2 connected to the controller and in contact with metal contacts 502 and 504, respectively.

The method of laser trimming thin film resistor includes the following operations:

a. Probes P1, P2 are positioned on metal contacts 502, 504, as shown.

b. Laser 1004 generates the laser energy, while controller 1006 commands galvo 1008 to direct the laser energy to laser trim pad T. The laser energy ablates the resistor metal of laser trim pad T as galvo 1008 gradually deflects the laser energy along a laser cut path, which gradually increases the resistance of thin film resistor 402.

c. While the laser energy ablates the resistor metal (i.e., while the laser beam trims the resistor), controller 1006 (concurrently) measures the gradually increasing resistance of thin film resistor 402 between probes P1 and P2. When the measuring indicates that the resistance (as measured) is equal to a target resistance within a predetermined tolerance (e.g., <+/−1%, of the target resistance), the laser trimming is complete, and the laser trimming is stopped.

d. Probes P1, P2 are positioned on metal contacts of a next thin film resistor to be laser trimmed, and operations (b) and (c) repeat.

Figure 11B:
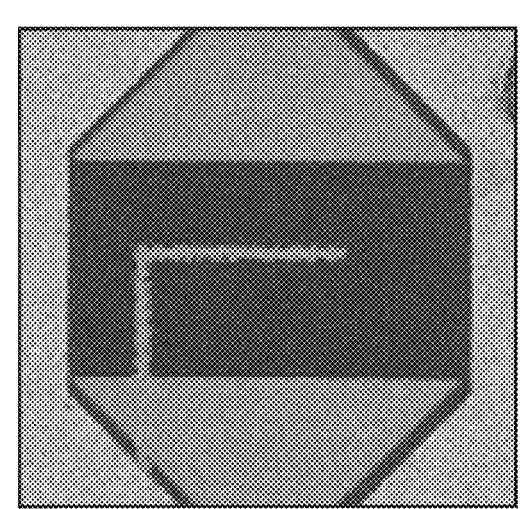
FIG. 11B is a photograph of the example laser trimmed resistor depicted in FIG. 11A that shows no blistering.
Figure 11A:
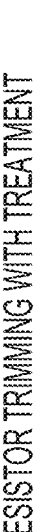
FIG. 11A is an illustration of an example laser trimmed resistor formed on a polyimide layer that was coated with a fluorinated moisture barrier layer prior to laser trimming and that shows no blistering.
Figure 11A:
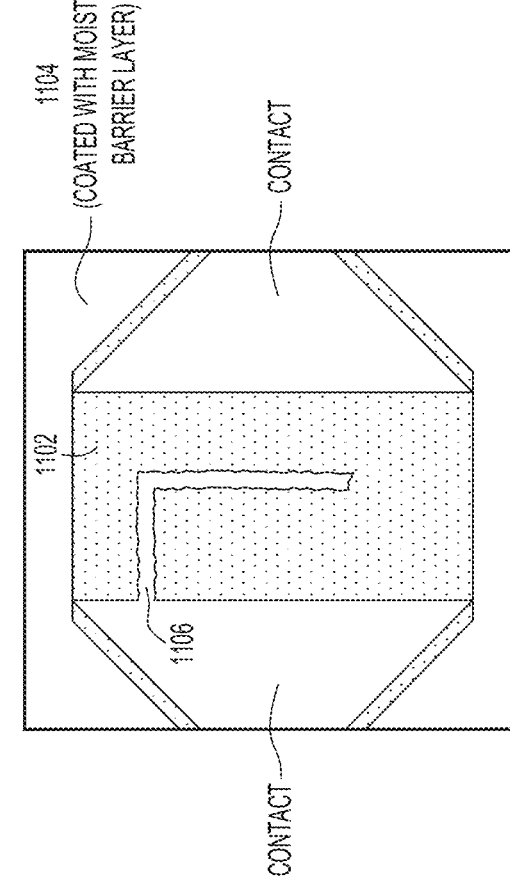

FIG. 11A is an illustration of an example laser trimmed resistor 1102 formed on a polyimide layer 1104 coated with a fluorinated moisture barrier layer (prior to the laser trimming). Laser trimmed resistor 1102 includes a laser cut path 1106, and is free of any blistering defect.

FIG. 11B is a photograph of the example laser trimmed resistor depicted in FIG. 11A that shows no blistering.

Figure 12B:
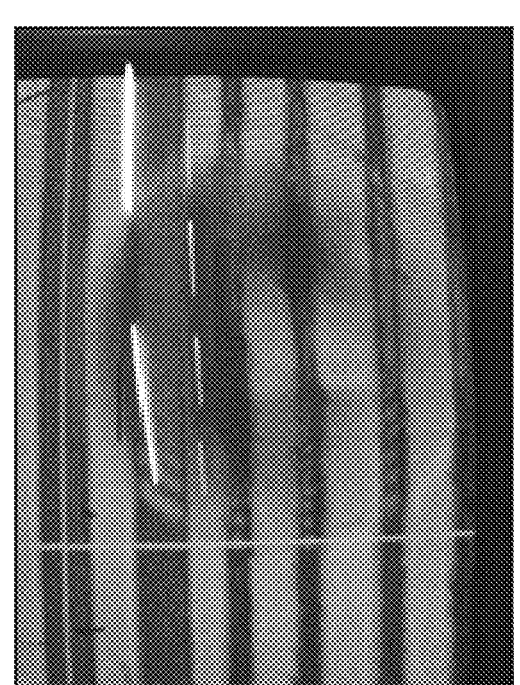
FIG. 12B is a photograph of the example laser trimmed resistor depicted in FIG. 12A that shows blistering.
Figure 12A:
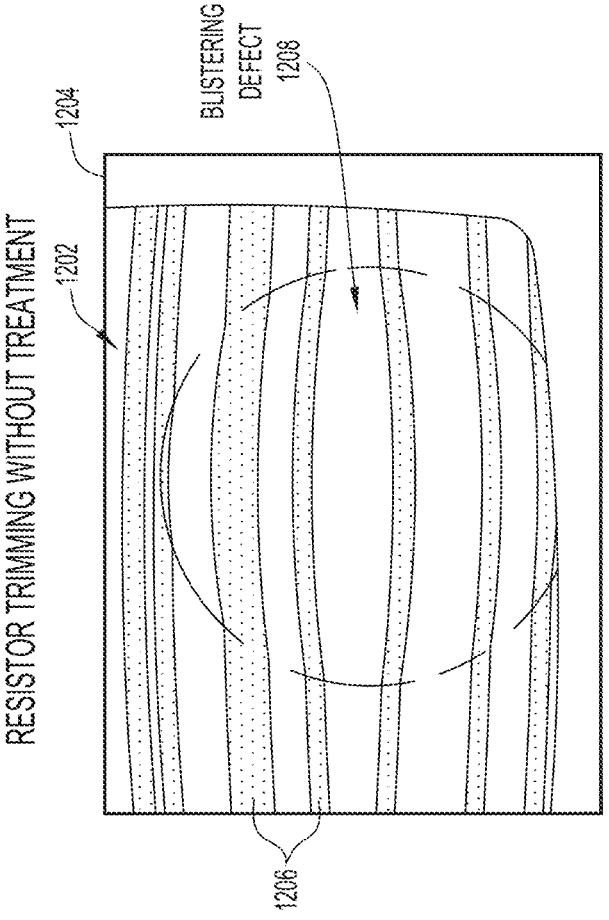
FIG. 12A is an illustration of an example laser trimmed resistor formed on a polyimide layer that was not coated with a fluorinated moisture barrier layer prior to laser trimming and that shows blistering.

FIG. 12A is an illustration of an example laser trimmed resistor 1202 formed on a polyimide layer 1204 that is not coated with a fluorinated moisture barrier layer (prior to the laser trimming). In other words, polyimide layer 1204 is formed without a subsequent surface modification treatment as described above. Laser trimmed resistor 1202 includes multiple laser cut paths 1206, and includes a blistering defect 1208 caused by the laser trimming.

FIG. 12B is a photograph of the example laser trimmed resistor depicted in FIG. 12A that shows blistering.

Figure 13:
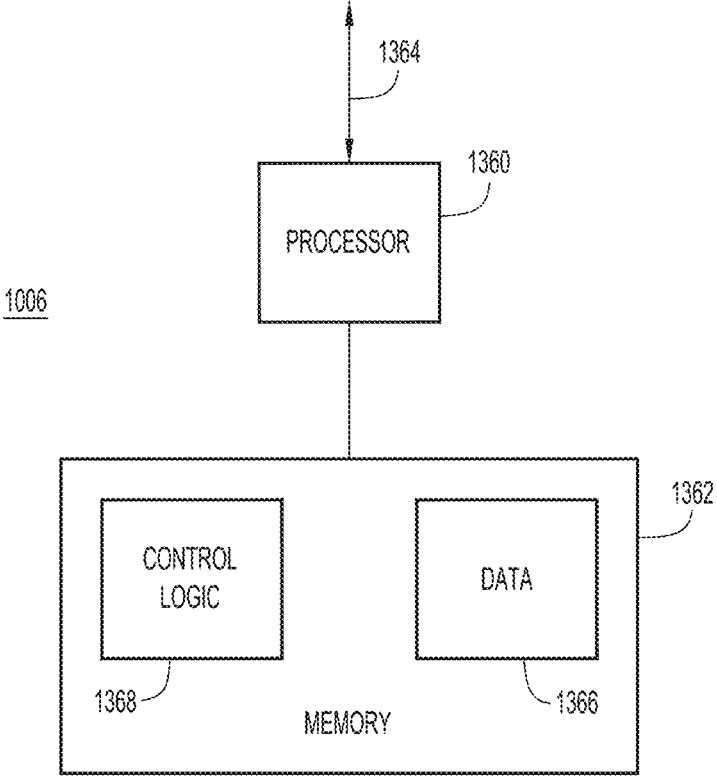
FIG. 13 is a block diagram of an example controller configured to perform/control resistor laser trimming operations.

FIG. 13 is a block diagram of controller 1006 configured to perform laser trimming operations described herein according to an embodiment. Controller 1006 includes processor(s) 1360 and a memory 1362 coupled to one another. The aforementioned components may be implemented in hardware (e.g., a hardware processor), software (e.g., a software processor), or a combination thereof. Processor(s) 1360 communicate with laser 1004 and galvo 1008 over hardware and/or software interfaces 1364, and are coupled to probes P1, P2 over the interfaces. Memory 1362 stores control software 1366 (referred as "control logic"), that when executed by the processor(s) 1360, causes the processor(s), and more generally, controller 1006, to perform the various operations described herein. The processor(s) 1360 may be a microprocessor or microcontroller (or multiple instances of such components). The memory 1362 may include read only memory (ROM), random access memory (RAM), magnetic disk storage media devices, optical storage media devices, flash memory devices, electrical, optical, or other physically tangible (i.e., non-transitory) memory storage devices. Controller 1006 may also be discrete logic embedded within an integrated circuit (IC) device.

Thus, in general, the memory 1362 may comprise one or more tangible (non-transitory) computer readable storage media (e.g., memory device(s)) including a first non-transitory computer readable storage medium, a second non-transitory computer readable storage medium, and so on, encoded with software or firmware that comprises computer executable instructions. For example, control software 1366 includes logic to implement operations performed by the controller 1006. Thus, control software 1366 implements the various methods/operations described herein.

In addition, memory 1362 stores data 1368 used and produced by control software 1366.

In some aspects, the techniques described herein relate to a method including: forming a polyimide layer; forming a thin film resistor on the polyimide layer; forming, on the thin film resistor and the polyimide layer, a metallization layer that includes metal contacts on opposing ends of the thin film resistor but leaves an exposed surface of the polyimide layer; baking the polyimide layer, the thin film resistor, and the metallization layer to remove water from the polyimide layer; forming, on the exposed surface of the polyimide layer, a hydrophobic moisture barrier layer that prevents absorption of water into the polyimide layer to avoid blistering of the thin film resistor during subsequent laser trimming of the thin film resistor; and laser trimming a resistance of the thin film resistor between the metal contacts.

In some aspects, the techniques described herein relate to a method, wherein: forming the hydrophobic moisture barrier layer includes forming a fluorinated moisture barrier layer on the exposed surface of the polyimide layer.

In some aspects, the techniques described herein relate to a method, wherein: forming the fluorinated moisture barrier layer includes plasma treating the exposed surface of the polyimide layer with carbon tetrafluoride to produce the fluorinated moisture barrier layer on the exposed surface.

In some aspects, the techniques described herein relate to a method, wherein: plasma treating includes plasma treating at a power, a pressure, and a gas flow rate configured to produce the fluorinated moisture barrier layer with a roughened surface to enhance hydrophobic properties of the fluorinated moisture barrier layer.

In some aspects, the techniques described herein relate to a method, wherein laser trimming includes: laser trimming the thin film resistor while measuring a resistance of the thin film resistor between the metal contacts; and when measuring indicates the resistance is equal to a target resistance within a tolerance, stopping laser trimming.

In some aspects, the techniques described herein relate to a method, wherein: forming the thin film resistor includes forming the thin film resistor to include a trim pad; and laser trimming includes laser trimming the trim pad.

In some aspects, the techniques described herein relate to a method, wherein: forming the polyimide layer includes baking the polyimide layer to evaporate solvent from the polyimide layer; and after baking, curing the polyimide layer.

In some aspects, the techniques described herein relate to a method, further including: providing a substrate and forming the polyimide layer on the substrate.

In some aspects, the techniques described herein relate to a method, wherein the substrate includes silicon.

In some aspects, the techniques described herein relate to a method, further including: forming alternated metallization layers and polyimide layers on the thin film resistor, the metallization layer, and the hydrophobic moisture barrier layer to produce a stack.

In some aspects, the techniques described herein relate to a method, further including: removing the substrate from the stack, leaving a flexible stack for an IC.

In some aspects, the techniques described herein relate to an integrated circuit stack including: a polyimide layer; a thin film resistor formed on the polyimide layer; a metallization layer having metal contacts formed on opposing ends of the thin film resistor and that leave an exposed surface of the polyimide layer; and a hydrophobic moisture barrier layer formed on the exposed surface of the polyimide layer and that prevents absorption of water into the polyimide layer to avoid blistering of the thin film resistor when the thin film resistor is laser trimmed, wherein the thin film resistor is laser trimmed to a target resistance between the metal contacts.

In some aspects, the techniques described herein relate to an integrated circuit stack, wherein: the hydrophobic moisture barrier layer includes a fluorinated moisture barrier layer.

In some aspects, the techniques described herein relate to an integrated circuit stack, wherein: the thin film resistor includes a trim pad that is laser trimmed to the target resistance.

In some aspects, the techniques described herein relate to an integrated circuit stack, wherein: the thin film resistor includes one of nickel chromium, tantalum nitride, and chrome silicide.

In some aspects, the techniques described herein relate to an integrated circuit stack, further including: alternated metallization layers and polyimide layers on the thin film resistor, the metallization layer, and the hydrophobic moisture barrier layer that collectively form the integrated circuit stack.

In some aspects, the techniques described herein relate to an integrated circuit stack, wherein: the alternated metallization layers, the polyimide layers on the thin film resistor, the metallization layer, and the hydrophobic moisture barrier layer collectively form flex redistribution layers.

In some aspects, the techniques described herein relate to an integrated circuit stack, wherein the integrated circuit stack does not include a silicon substrate.

In some aspects, the techniques described herein relate to a method including: forming a polyimide layer; forming multiple thin film resistors on the polyimide layer; forming, on the multiple thin film resistors and the polyimide layer, a metallization layer that includes metal contacts on opposing ends of each thin film resistor but leaves an exposed surface of the polyimide layer; baking the polyimide layer, the multiple thin film resistors, and the metallization layer to remove water from the polyimide layer; forming, on the exposed surface of the polyimide layer, a hydrophobic moisture barrier layer that prevents absorption of water into the polyimide layer to avoid blistering of the multiple thin film resistors during subsequent laser trimming of the multiple thin film resistors; and laser trimming a resistance of each thin film resistor between the metal contacts for each thin film resistor.

In some aspects, the techniques described herein relate to a method, wherein: forming the hydrophobic moisture barrier layer includes forming a fluorinated moisture barrier layer on the exposed surface of the polyimide layer.

As used herein, terms such as first and second, left and right, top and bottom, and upper and lower, are relative and may be used in place of each other. For example, first and left (or right) may be used interchangeably, second and right (or left) may be used interchangeably, first and upper (or lower) may be used interchangeably, and second and lower (or upper) may be used interchangeably. As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

The above description is intended by way of example only. Although the techniques are illustrated and described herein as embodied in one or more specific examples, it is nevertheless not intended to be limited to the details shown, since various modifications and structural changes may be made within the scope and range of equivalents of the claims.

What is claimed is:

1. A method comprising:
forming a polyimide layer;
forming a thin film resistor on the polyimide layer;
forming, on the thin film resistor and the polyimide layer, a metallization layer that includes metal contacts on opposing ends of the thin film resistor but leaves an exposed surface of the polyimide layer;
baking the polyimide layer, the thin film resistor, and the metallization layer to remove water from the polyimide layer;
forming, on the exposed surface of the polyimide layer, a hydrophobic moisture barrier layer that prevents absorption of water into the polyimide layer to avoid blistering of the thin film resistor during subsequent laser trimming of the thin film resistor; and
laser trimming a resistance of the thin film resistor between the metal contacts.

2. The method of claim 1, wherein:
forming the hydrophobic moisture barrier layer includes forming a fluorinated moisture barrier layer on the exposed surface of the polyimide layer.

3. The method of claim 2, wherein:
forming the fluorinated moisture barrier layer includes plasma treating the exposed surface of the polyimide layer with carbon tetrafluoride to produce the fluorinated moisture barrier layer on the exposed surface.

4. The method of claim 3, wherein:
plasma treating includes plasma treating at a power, a pressure, and a gas flow rate configured to produce the fluorinated moisture barrier layer with a roughened surface to enhance hydrophobic properties of the fluorinated moisture barrier layer.

5. The method of claim 1, wherein laser trimming includes:
laser trimming the thin film resistor while measuring a resistance of the thin film resistor between the metal contacts; and
when measuring indicates the resistance is equal to a target resistance within a tolerance, stopping laser trimming.

6. The method of claim 1, wherein:
forming the thin film resistor includes forming the thin film resistor to include a trim pad; and
laser trimming includes laser trimming the trim pad.

7. The method of claim 1, wherein:

forming the polyimide layer includes baking the polyimide layer to evaporate solvent from the polyimide layer; and after baking, curing the polyimide layer.

8. The method of claim 1, further comprising:

providing a substrate and forming the polyimide layer on the substrate.

9. The method of claim 8, wherein the substrate includes silicon.

10. The method of claim 8, further comprising:

forming alternated metallization layers and polyimide layers on the thin film resistor, the metallization layer, and the hydrophobic moisture barrier layer to produce a stack.

11. The method of claim 10, further comprising:

removing the substrate from the stack, leaving a flexible stack for an IC.

12. An integrated circuit stack comprising:

a polyimide layer;

a thin film resistor formed on the polyimide layer;

a metallization layer having metal contacts formed on opposing ends of the thin film resistor and that leave an exposed surface of the polyimide layer; and a hydrophobic moisture barrier layer formed on the exposed surface of the polyimide layer and that prevents absorption of water into the polyimide layer to avoid blistering of the thin film resistor when the thin film resistor is laser trimmed, wherein the thin film resistor is laser trimmed to a target resistance between the metal contacts.

13. The integrated circuit stack of claim 12, wherein:

the hydrophobic moisture barrier layer includes a fluorinated moisture barrier layer.

14. The integrated circuit stack of claim 12, wherein:

the thin film resistor includes a trim pad that is laser trimmed to the target resistance.

15. The integrated circuit stack of claim 12, wherein:

the thin film resistor comprises one of nickel chromium, tantalum nitride, and chrome silicide.

16. The integrated circuit stack of claim 15, wherein the integrated circuit stack does not include a silicon substrate.

17. The integrated circuit stack of claim 12, further comprising:

alternated metallization layers and polyimide layers on the thin film resistor, the metallization layer, and the hydrophobic moisture barrier layer that collectively form the integrated circuit stack.

18. The integrated circuit stack of claim 17, wherein:

the alternated metallization layers, the polyimide layers on the thin film resistor, the metallization layer, and the hydrophobic moisture barrier layer collectively form flex redistribution layers.

19. A method comprising:

forming a polyimide layer;

forming multiple thin film resistors on the polyimide layer;

forming, on the multiple thin film resistors and the polyimide layer, a metallization layer that includes metal contacts on opposing ends of each thin film resistor but leaves an exposed surface of the polyimide layer;

baking the polyimide layer, the multiple thin film resistors, and the metallization layer to remove water from the polyimide layer;

forming, on the exposed surface of the polyimide layer, a hydrophobic moisture barrier layer that prevents absorption of water into the polyimide layer to avoid blistering of the multiple thin film resistors during subsequent laser trimming of the multiple thin film resistors; and laser trimming a resistance of each thin film resistor between the metal contacts for each thin film resistor.

20. The method of claim 19, wherein:

forming the hydrophobic moisture barrier layer includes forming a fluorinated moisture barrier layer on the exposed surface of the polyimide layer.

\* \* \* \* \*